United States Patent [19]
Codama et al.

[11] Patent Number: 6,114,805
[45] Date of Patent: Sep. 5, 2000

[54] ORGANIC ELECTROLUMINESCENT DISPLAY WITH FILTER LAYER

[75] Inventors: Mitsufumi Codama, Ibaraki; Osamu Onitsuka, Chiba, both of Japan

[73] Assignee: TDK Corporation, Tokyo, Japan

[21] Appl. No.: 09/113,157

[22] Filed: Jul. 10, 1998

[30] Foreign Application Priority Data

Jul. 18, 1997  [JP]  Japan ................................. 9-209957

[51] Int. Cl.[7] ........................... H05B 33/02; H05B 33/22
[52] U.S. Cl. ......................... 313/509; 313/112; 313/504
[58] Field of Search ................................. 313/500, 503, 313/504, 505, 506, 509, 510, 112; 315/169.3; 345/76, 36, 45

[56] References Cited

U.S. PATENT DOCUMENTS

| 5,701,055 | 12/1997 | Nagayama et al. | 313/504 |
| 5,773,931 | 6/1998 | Shi et al. | 313/509 |

FOREIGN PATENT DOCUMENTS

| 0 732 868 | 9/1996 | European Pat. Off. | |
| 0 767 599 | 4/1997 | European Pat. Off. | H05B 33/12 |
| 0 884 930 | 12/1998 | European Pat. Off. | H05B 33/22 |
| 196 03 451 | 8/1996 | Germany | G09F 9/33 |
| 8-202287 | 8/1996 | Japan | G09F 9/30 |
| 9-283280 | 10/1997 | Japan | H05B 33/10 |
| 9-330792 | 12/1997 | Japan | H05B 33/12 |

*Primary Examiner*—Michael H. Day
*Attorney, Agent, or Firm*—Oblon, Spivak, McClelland, Maier & Neustadt, P.C.

[57] ABSTRACT

An organic electroluminescent display includes a substrate (1), and, in order from the substrate, a hole injection electrode, at least one organic layer, an electron injecting electrode, and a sealing plate, and wherein the substrate further includes thereon an element-isolating structure (7,8) for isolating planar structures of the organic layer and the electron injection electrode from each other during film formation, the element isolating structure being a solid structure containing a base part formed on the substrate side and an overhang part larger in width than the base part, and provided on a portion where the organic layer is isolated from the electron injecting electrode as well as other portions, so that the element isolating structure can function as a spacer for the sealing plate, and at least one type of filter layer (14a–14c) is interleaved between the element-isolating structure serving as the spacer and the substrate.

13 Claims, 2 Drawing Sheets

ORGANIC ELECTROLUMINESCENT DISPLAY WITH FILTER LAYER

FIELD OF THE INVENTION

The present invention relates generally to an organic electroluminescent display (which will hereinafter be often called an organic EL display for short) using an organic compound, and more particularly to a spacer located between a substrate and a sealing plate thereof.

DESCRIPTION OF THE BACKGROUND

In recent years, organic EL devices have been under intensive investigation. One organic EL device basically comprises a hole injecting electrode, a thin film formed on the hole injecting electrode by evaporating a hole transporting material such as triphenyldiamine (TPD), a light emitting layer of a fluorescent material such as an aluminum quinolinol complex ($Alq^3$) laminated on the hole transporting thin film, and a metal electrode (an electron injecting electrode) formed thereon from a metal having a low work function such as magnesium or Mg. This organic EL device attracts attentions because it can achieve a very high luminance ranging from several hundreds to tens of thousands $cd/m^2$ with a voltage of approximately 10 volts.

In a typical process of providing such an organic EL display in a film form, for instance, an ITO transparent electrode in a film form is first provided. Then, only light emitting portions are exposed from the ITO transparent electrode while the rest thereof is covered with an insulating layer. Finally, organic layers and electron injecting electrodes, each in a film form, are provided on the transparent electrode so that a given light emitting pattern can be obtained. In this case, while the electron injecting electrodes serve as common electrodes, a given voltage is applied between each ITO transparent electrode providing a light emitting portion and the associated electron injecting electrode, so that the desired light emitting portion can give out light. Consequently, it is preferable that the electron injecting electrodes providing common electrodes and organic layers connected thereto are isolated for each segment group, each data line (scanning line) or the like, so that they can be independently driven. To this end, various means for element isolation have so far been developed in the art.

An element-isolating structure set forth in JP-A-9-330792 (as spacer, and overhang members) is known for the element-isolating means. This element-isolating structure is obtained by providing an insulating layer on a hole injecting electrode according to a film pattern, forming a spacer layer such as a polyimide layer thereon, coating a positive resist material on the spacer layer to form a photo-pattern for element isolation, and developing the photo-pattern for removal of unexposed portions and the spacer layer underneath them. Details of this element-isolating structure are disclosed in the specification, and so are no longer described.

When the organic EL device is exposed to the outside air, on the other hand, the electrodes oxidize while the organic layers degrade due to moisture. For this reason, it is required to use a structure in which they are airtightly confined to shield them from the outside air, for instance, by providing a protective or sealing film after the provision of the electron injecting electrode or providing a sealing plate on the side of the electron injecting electrode that is not opposite to the substrate. Among these, the sealing plate is particularly effective for protecting the organic layers against mechanical external force, and so can be a structural member indispensable for displays. If the sealing plate is pressed on the peripheral portion of the substrate where a spacer higher than laminated organic EL device structures such as organic layers and electron injection electrode, and an adhesive agent serving as a sealing material have been provided, the sealing plate can then be located at a position spaced away from the substrate by the height of the spacer, i.e., at a position that does not interfere with the organic EL structures such as organic layers and electron injecting electrode.

In most cases, however, a glass or synthetic resin plate actually used as the sealing plate is uneven in thickness or irregular in surface shape, or is otherwise distorted. Even though the sealing plate is located at an end position higher than the organic EL structures, the organic EL device structures often interfere with the sealing plate due to a distortion of the sealing plate, etc., resulting in damage to, and a breakdown of, the organic EL device structures. Such interference with the sealing plate may be avoided by imparting an adequate height to the spacer. If a spacer usually formed by means of photolithography is too thick, however, it will then have an adverse influence on the photolithographic step to be carried out after the provision of the spacer, resulting in a distortion of other pattern configuration located in the vicinity of the spacer. That is, when it is necessary to carry out the photolithographic step subsequently to the provision of the spacer, the thickness of the spacer provided prior to the photolithographic step is limited to approximately 10 $\mu$m. Thus, the spacer-incorporating step should be carried out after the provision of the element-isolating structure.

A printing process of forming a polyimide or other resin film of, e.g., 20 to 50 $\mu$m in thickness is suitable for the provision of a thick spacer. However, a problem inherent in the printing process is that exposed portions of the surface of the electrode on which organic films are to be provided are susceptible to contamination, often resulting in defects such as light emission variations.

A material for forming a thick resist of about 20 to 50 $\mu$m in one coating operation by means of photolithograpy, on the other hand, is known in the art. In order for the formation of a thick resist to have no influence on the element-isolating structure, however, the material to be selected for the element-isolating structure is under severe limitations. In either case, some considerable expense incurs due to the need of an additional step.

SUMMARY OF THE INVENTION

It is therefore an object of the invention to provide an organic EL display which can surely be protected against interference with a sealing plate, with a simplified arrangement yet with no need of adding an extra production step.

This object is achieved by the inventions defined below as (1) to (3).

(1) An organic EL display comprising a substrate, and, in order from said substrate, a hole injecting electrode, at least one organic layer, an electron injecting electrode, and a sealing plate, wherein:

said substrate further includes thereon a element-isolating structure for isolating planar structures of said organic layer and said electron injecting electrode from each other during film formation, said element-isolating structure being a solid structure comprising a base part formed on a substrate side and an overhang part larger in width than said base part, and being provided on a portion where said organic layer is isolated from said electron injecting electrode as well as other portion, so that said element-isolating structure can function as a spacer for said sealing plate.

(2) The organic EL display according to (1), wherein said element-isolating structures serving as said spacer has a height of 1 to 20 µm.

(3) The organic EL display according to (1) or (2), wherein at least one type of filter layer is interleaved between said element-isolating structure serving as said spacer and said substrate.

BRIEF DESCRIPTION OF THE DRAWINGS

The above and other objects, features, and advantages of the invention will be better understood from the following description taken in conjunction with the accompanying drawings.

DETAILED DESCRIPTION OF THE PREFERRED EMBODIMENTS

Figure 1:
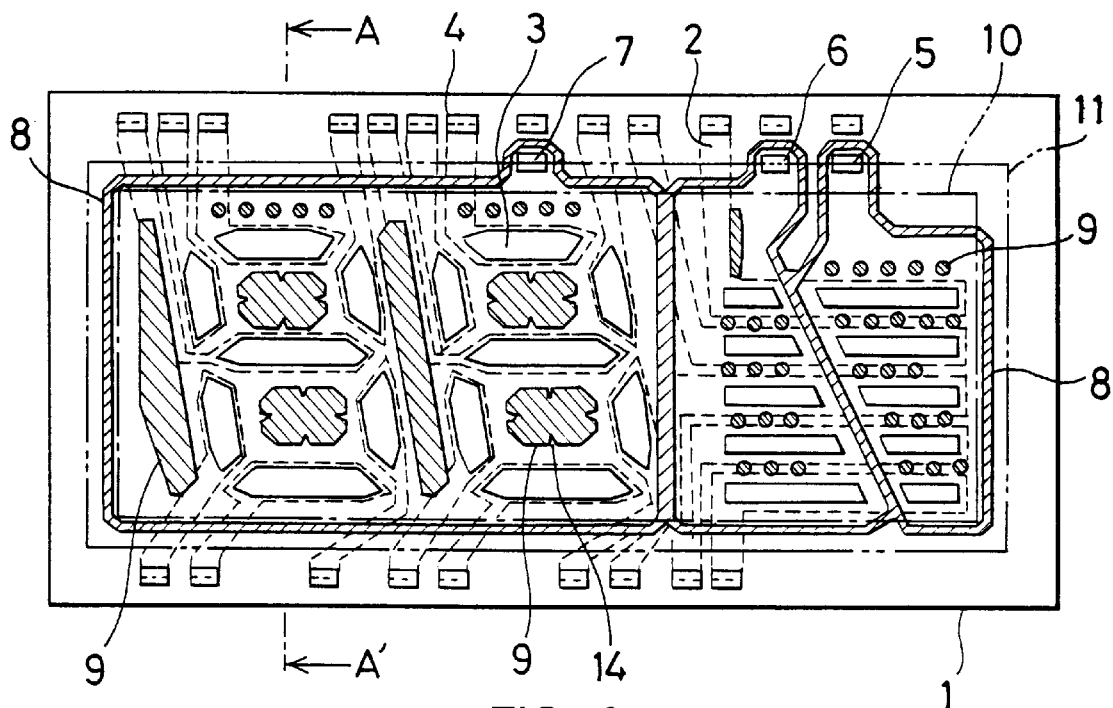
FIG. 1 is a plan schematic illustrative of one embodiment of the organic EL display according to the invention.

Some preferred embodiments of the invention will now be explained at great length.

One organic EL display of the present invention comprises a substrate, and, in order from the substrate, a hole injecting electrode, at least one organic layer, an electron injecting electrode, and a sealing plate. The substrate further includes thereon an element-isolating structure for isolating planar structures of the organic layer and electron injecting electrode from each other during film formation. The element-isolating structure is a solid structure comprising a base part formed on a substrate side and an overhang region larger in width than the base part, and is provided on a portion where the organic layer is isolated from the electron injecting electrode as well as on other portion, so that the element-isolating structure can function as a spacer for the sealing plate.

The element-isolating structure is located at a site other than the portion where the elements are isolated from each other in such a manner that it can also function as a spacer, whereby the spacer can be provided at the step of providing the element-isolating structure. In addition, by locating the element-isolating structure at a suitable site, it is also possible to locate the spacer within the organic EL display, thereby avoiding interference between the sealing plate and the organic EL device structures, which may otherwise be caused by a distortion, etc. of the sealing plate.

The element-isolating structure is a solid structure which, as disclosed in JP-A-9-330792, comprises a base part (spacer) and an overhang part provided above the base part and larger in width than the base part. Usually, the element-isolating structure is provided at a portion where elements are isolated from each other. Particles sputtered or deposited by evaporation to regions other than the element-isolating structure and the region shaded thereby are built up to form elements in the respective regions.

No particular limitation is imposed on the material used to form the element-isolating structure. However, it is preferable to use a material that does not interfere with structural layers used with the organic EL display and makes no electrical connections between them, because the element-isolating structure is provided on the hole injecting electrode and insulating layer, on which the organic layer, electron injecting electrode, etc. are provided. Although the base, and overhang parts may be formed of the same or different materials, it is preferable to use a different material for each part because an overhang configuration is easily obtained. The material used for the formation of the base part includes an organic resin film such as a polyimide or acrylic resin film, an inorganic insulating film such as an $SiO_2$, $SiN_x$, a-Si or SOG (spin on glass) film, and a metal thin film that can be easily thickened and has limited stress, for instance, an Al film, with the polyimide resin, $SiO_2$, SOG, and Al films being preferred. The material usable for the formation of the overhang part is preferably a photosensitive material such as a photoresist or photosensitive polyimide. Use may also be made of a hard insulating or semiconducting film such as an $SiO_2$, $SiN_x$, $Al_2O_3$, $CrO_x$, a-Si or SiC film, or an electrically conductive thin film such as a Cr, Ta, Mo, Ni, W, Ti, TiN, ZnO or ITO thin film. Use may further be made of a laminate comprising a photosensitive film laminated on an insulating or semiconductive film, or an electrically conductive thin film. Among these, the photoresist, $SiO_2$, Cr, and Ti are preferred.

The size of the base part is not particularly critical, and the base part can well serve its own function if its width is 1 µm or more. However, it is preferable that the base part has a width of at least 5 µm and a height (thickness) of at least 0.2 µm, and especially about 0.5 µm to about 10 µm. The size of the overhang part is again not particularly critical. However, the overhang part has preferably a structure in which the overhang length is usually equal to or greater than the half of the thickness of the base part. The overhang part has preferably a height (thickness) of the order of 0.1 to 10 µm, and especially 0.2 to 5 µm. The total thickness of the base, and overhang parts is of the order of 1 to 20 µm, and especially 0.7 to 10 µm.

To provide the element-isolating structure, a base part layer made up of the aforesaid material for the base part is first provided on the substrate with the hole injecting electrode, insulating film, etc. provided thereon. To this end it is preferred that the resin or SOG film is provided by a spin or roll coating technique; the insulating or semi-conducting film is provided by a sputtering or CVD technique; and the metal film is provided by evaporation, etc. Then, a photosensitive overhang part layer is provided on the base part layer as mentioned just above. Simultaneously with or after patterning of the overhang part layer by exposure, and development, the base part layer is etched, and then over-etched in such a manner that the base part layer is smaller in size than the overhang part layer, thereby obtaining an overhang body.

Preferably, the element-isolating structure of the invention serving as a spacer is higher (larger) than that for ordinary element isolation. If the element-isolating structure is higher than such an ordinary element-isolating structure, it is then possible to avert trouble with element isolation. In this regard, it is to be noted that the ordinary element-isolating structure may often deform or break down due to interference between it and the sealing plate.

No particular limitation is imposed on how to make the element-isolating structure serving as a space higher than the ordinary element-isolating structure. For instance, when a color display is usually assembled, some filter layers such as color, and fluorescent filter layers are provided on a hole injecting electrode or an insulating film. If these filter layers are provided over a site where the element-isolating structure serving as a spacer is provided, the height of the element-isolating structure then increases by the thicknesses of the filter layers. Usually, these filter layers, when they have different colors, are not provided on the same region. However, if a plurality of such color filters are laminated together on the same region, it is then possible to achieve a much higher element-isolating structure. Each filter layer has preferably a thickness of the order of 2 to 20 μm, and especially 5 to 20 μm.

The shape and size of the element-isolating structure serving as a spacer, and where it is located may be appropriately determined depending on the size, structure, etc. of the display to be assembled.

The sealing plate used herein may be either transparent or opaque, if the emitted light is taken out of the substrate side. However, if the emitted light is taken out of the sealing plate side, too, the sealing plate may be made up of a transparent or semitransparent material. The transparent or semitransparent material used to this end includes glass, quartz, and resins such as polyimide, polyethylene terephthalate, polycarbonate, and polypropylene, with the glass being most preferred. Use may also be made of metals such as Al, SUS, Ti, and Ni. For the organic EL display according to the invention, it is possible to select from glass materials a specific glass material that is susceptible to distortion and so relatively inexpensive, because a distortion of the sealing plate is absorbed by the element-isolating structure serving as a spacer.

Some exemplary embodiments of the organic EL display according to the invention are explained with reference to FIGS. 1 to 4.

Figure 2:
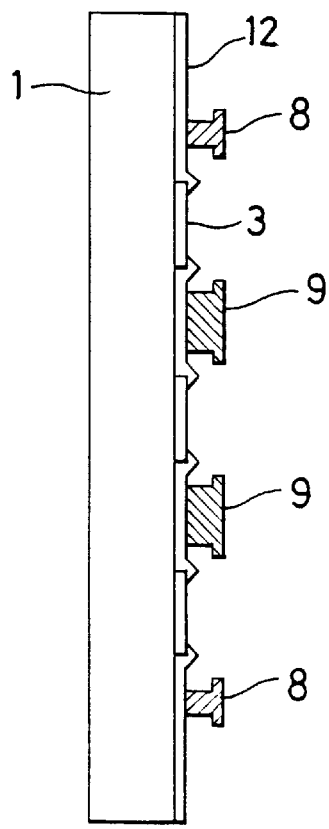
FIG. 2 is a sectional schematic as taken along the A—A' line in FIG. 1.
Figure 3:
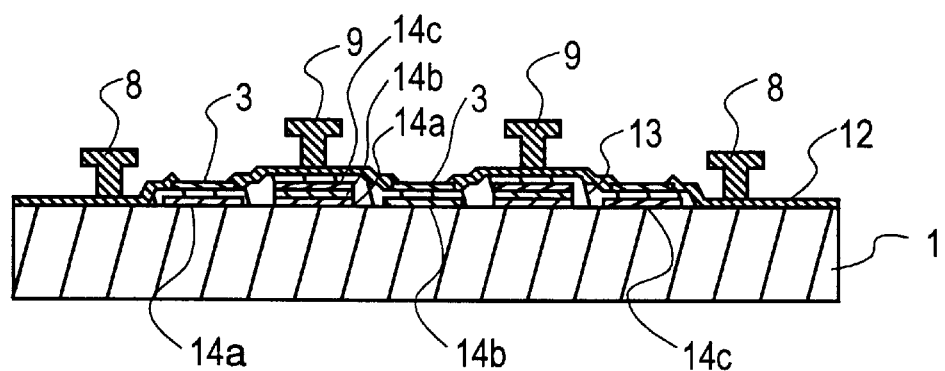
FIG. 3 is a sectional schematic illustrative of another embodiment of the organic EL display according to the invention.
Figure 4:
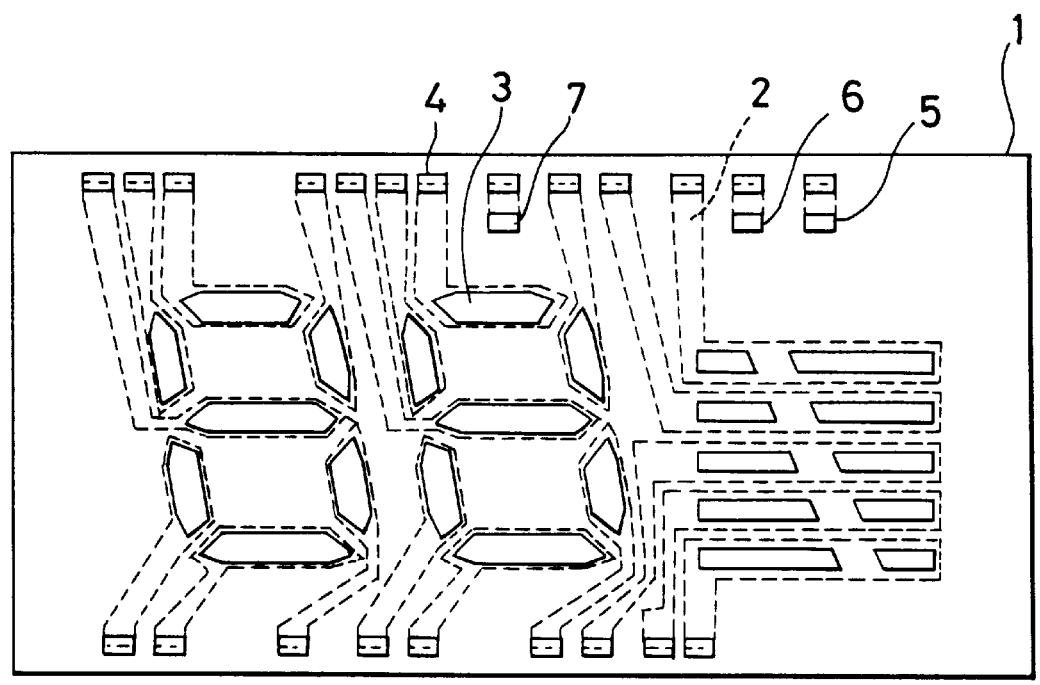
FIG. 4 is a plan schematic illustrative of in what state a hole injecting electrode and an insulating film are provided on a substrate in the display of FIG. 1.

FIG. 1 is a plan schematic illustrative of one exemplary embodiment of the organic EL display according to the invention, FIG. 2 is a sectional schematic as taken along the A—A' line in FIG. 1, and FIG. 3 is a sectional schematic illustrative of another embodiment of the invention. FIG. 4 is a plan view illustrative of one pattern of the hole injecting electrode and insulating film before the element-isolating structure is provided.

In an organic EL display shown in FIG. 1, 2, or 4 by way of example, a hole injecting electrode (an ITO transparent electrode) 2 is provided over a predetermined region shown by a broken line on a substrate 1. Then, an insulating film 12 is provided on an area of the hole injecting electrode 2 except a light emitting portion 3 and a terminal portion 4 shown by solid lines. Finally, an organic layer, and an electron injecting electrode are provided on the insulating film 12 to emit light according to a predetermined pattern.

After the hole injecting electrode 2 and insulating film 12 are provided as shown in FIG. 4, an ordinary element-isolating structure 8 and an element-isolating structure 9 serving as a spacer are simultaneously provided to construct the organic EL display according to the invention, as shown in FIGS. 1, and 2. As illustrated, the ordinary element-isolating structure 8 is so provided that segment groups divided for each display function are isolated from one another. Each area isolated by the element-isolating device 8 is provided with an organic layer 10 shown by a one-dotted line and an electron injecting electrode shown by a two-dotted line, each in a film form, so that common electrodes 5, 6, and 7 are provided for each area.

The element-isolating structure 9 serving as a spacer, which is provided simultaneously with the ordinary element-isolating structure 8, is located at a position that is undetrimental to light emission and on an area other than the portion where the ordinary element-isolating structure 8 is provided. As illustrated, the size and shape of the element-isolating structure 9 may be appropriately determined in such a manner that they are undetrimental to light emission. In some cases, the area of the electron injecting electrode film 11 formed becomes small as the area of the element-isolating structure 9 becomes large, or the area of the electron injecting electrode film 11 is divided by the area of the element-isolating structure 9, resulting in an increase in the resistance value of the electron injecting electrode 11 connected to the respective common electrodes 5, 6, and 7. It is thus preferable that the size and shape of the element-isolating structure 9 are designed in such a manner that the resistance value increase is avoidable. In the embodiment illustrated, two element-isolating structures 9 are provided, one in each of regions defined by 7 segments arranged in an 8-shaped configuration. Each element-isolating structure 9 is preferably provided with a notch 14 that is open at an angle of up to 90°. Through this notch 14 a portion of the electron injecting electrode 11 provided on the element-isolating structure 9 makes a connection with a portion of the electron injecting electrode 11 provided on a region where the element-isolating structure 9 is not provided, thereby reducing resistance increases.

Another embodiment of the organic EL display according to the invention is explained with reference to FIG. 3. The embodiment comprises first to third color filter layers 14a, 14b, and 14c as color displays, and the first to third color filter layers 14a, 14b, and 14c, for instance, correspond to red, green, and blue filters, respectively. First to third filter layers 14a, 14b, and 14c are also laminated on the portion where the element-isolating structure 9 serving as a spacer is provided, thereby making the spacer higher than the ordinary element-isolating structure. According to this embodiment, filter layers 14a, 14b, and 14c can be provided on the region on which the element-isolating structure 9 is provided, simultaneously with filter layers 14a, 14b, and 14c which must usually be provided on the light emitting portion 3 or the like. This is achieved with no addition of any extra step. To ensure the flatness of the portion on which the hole injecting electrode 2 is provided, it is preferable to provide an overcoat layer 13 on the portion on which the hole injecting electrode 2, and insulating layer 12 are provided.

To take the emitted light out of the substrate side, it is usually preferable that the hole injecting electrode is a transparent electrode. The transparent electrode may be made up of ITO (tin-doped indium oxide), IZO (zinc-doped indium oxide), ZnO, $SnO_2$, $In_2O_3$, etc., with ITO (tin-doped indium oxide) being preferred. The transparent electrode has preferably at least a certain thickness enough for electron injection, e.g., of 10 to 200 nm, and especially 50 to 120 nm.

The transparent electrode is preferably formed by a sputtering technique, although it may be formed by an evaporation or other technique. When sputtering is applied to the formation of the ITO transparent electrode, it is preferable to use a target obtained by doping $In_2O_3$ with $SnO_2$. When a film form of metal or barrier electrode is formed, it is preferable to form a sintered body of the aforesaid starting metal or its alloy by means of DC or RF sputtering. A film form of ITO transparent electrode obtained by sputtering is much more reduced than that obtained by evaporation in terms of the change-with-time of light emission luminance. The input power is preferably in the range of 0.1 to 4 $W/cm^2$. Input power for a DC sputtering system in particular is preferably in the range of 0.1 to 10 $W/cm^2$, and especially 0.5 to 7 $W/cm^2$. The film formation rate is preferably in the range of 5 to 100 nm/min., and especially 10 to 50 nm/min.

No particular limitation is imposed on the sputtering gas used; that is, use may be made of inert gases such as Ar, He, Ne, Kr, and Xe, or their mixture. The sputtering pressure of such sputtering gas may usually be in the range of about 0.1 Pa to 20 Pa.

The organic layer formed after the provision of the respective element-isolating structures 8 and 9 comprises at least one hole transporting layer and at least one light emitting layer, and includes an electron injecting electrode thereon. The organic layer may be provided with a protective electrode in the form of the uppermost layer. It is here to be noted that the hole transporting layer may be dispensed with. The electron injecting electrode is then formed of a metal, compound or alloy material having a low work function by means of evaporation or sputtering, and preferably sputtering.

For the material forming the electron injecting electrode, it is preferable to use a substance having a low work function so as to achieve efficient electron injection, for instance, alkaline metals, alkaline earth metals, or alloys containing 0.1 to 20 at% of these metals. However, it is to be understood that the invention imposes no particular limitation on the material for the electron injecting electrode.

In the electron injecting electrode film formed by the sputtering technique, the atoms or atom groups upon sputtering have a kinetic energy relatively higher than would be obtained with the evaporation technique, so that the adhesion of the electron injecting electrode film to the organic layer at their interface is improved due to a surface migration effect. In addition, an oxide layer is removed in vacuum from the surface of the electrode by pre-sputtering or moisture or oxygen is removed from the organic layer interface, on which they are adsorbed, by reverse sputtering to form a clean electrode-organic layer interface or a clean electrode, so that consistent organic EL displays of high quality can be produced. For the target, the alloy having the aforesaid composition range, and pure metal may be used alone or in combination with an additional target comprising the subordinate component or components or with the addition of the subordinate component or components thereto. It is also acceptable to use a mixture of materials having largely varying vapor pressures as the target, because there is only slight a deviation of the composition of the resultant film from the target composition. There is thus no limitation on the material used with the sputtering technique, whereas there are some limitations such as vapor pressure on the evaporation technique. The sputtering technique is additionally advantageous over the evaporation technique in terms of consistent film thickness and quality as well as productivity, because it is unnecessary to feed the raw material over an extended period of time.

The electron injecting electrode formed by the sputtering technique is a film so very dense that the penetration of moisture into the film is much more reduced as compared with a coarse film prepared by evaporation, and so the chemical stability of the film is much more increased. This ensures the production of organic EL displays having an ever longer service life.

Preferably, the sputtering gas pressure during sputtering is in the range of 0.1 to 5 Pa. By regulating the sputtering gas pressure within this range, it is possible to easily obtain an AlLi alloy having an Li concentration in the aforesaid range. By altering the sputtering gas pressure in the aforesaid range during film formation, it is also possible to easily obtain an electron injecting electrode having such an Li concentration gradient as defined above.

For the sputtering gas, use is made of inert gases employed with ordinary sputtering systems. For reactive sputtering, reactive gases such as $N_2$, $H_2$, $O_2$, $C_2H_4$, and $NH_3$ may be used in addition to these gases.

In the practice of the invention, it is possible to use an RF sputtering process using an RF power source or the like as the sputtering technique. In view of the ease with which the film forming rate is controlled, and less damage to an organic EL device structure, however, it is preferable to use a DC sputtering process. Power for operating a DC sputtering system is in the range of preferably 0.1 to 10 W/cm$^2$, and especially 0.5 to 7 W/cm$^2$. The film formation rate is preferably in the range of 5 to 100 nm/min., and especially 10 to 50 nm/min.

The thin film form of electron injecting electrode may have at least a certain thickness enough for the injection of electrons, e.g., of at least 1 nm, and preferably at least 3 nm. Thus, a film thickness of the order of 3 to 500 nm is usually preferable although there is no upper limit thereon.

The organic EL display of the invention has preferably a protective electrode on the electron injecting electrode, i.e., on the side of the electron injecting electrode that is not opposite to the organic layer. By the provision of the protective electrode, the electron injecting electrode is protected against the air, moisture, etc., so that the degradation of the constituting thin film can be prevented, resulting in the stabilization of electron injection efficiency and an ever greater increase in the service life of the device. The protective electrode has a very low resistance, and so may also function as an interconnecting electrode when the electron injecting electrode has a high resistance. The protective electrode may be formed of at least one of Al; Al and a transition metal. In particular, favorable results are obtained when Al or Al and a transition metal are used as the interconnecting electrode to be described later. TiN, on the other hand, provides a film having a striking sealing effect because of its good corrosion resistance. For TiN, an about 10% deviation from its stoichiometric composition is acceptable. In addition, Al alloys, and transition metal alloys may contain transition metals, especially, scandium or Sc, niobium or Nb, zirconium or Zr, hafnium or Hf, neodymium or Nd, tantalum or Ta, copper or Cu, silicon or Si, chromium or Cr, molybdenum or Mo, manganese or Mn, nickel or Ni, palladium or Pd, platinum or Pt and tungsten or W in the total amount of up to 10 at%, especially up to 5 at%, and more especially up to 2 at%. When the protective electrode functions as the interconnecting material, the thin film resistance becomes lower with a decrease in the content of the transition metal.

The protective electrode may have at least a certain thickness enough to make sure of electron injection efficiency and prevent penetration of moisture, oxygen or organic solvents, for instance, of at least 50 nm, preferably at least 100 nm, and especially 100 to 1,000 nm. With too thin a protective electrode layer, sufficient connection with terminal electrodes is not obtainable because the ability of the protective electrode to cover steps becomes low. When the protective electrode layer is too thick, on the other hand, the growth rate of dark spots becomes high because of an increase in the stress of the protective electrode layer. It is here to be noted that when the protective electrode functions as an interconnecting electrode, its thickness may be usually of the order of 100 to 500 nm so as to make up for the high film resistance of the electron injecting electrode due to its thinness, and that when the protective electrode functions as other interconnecting electrode, its thickness may be of the order of 100 to 300 nm.

Preferably but not exclusively, the total thickness of the electron injecting electrode plus the protective electrode is usually of the order of 100 to 1,000 nm.

In addition to the aforesaid protective electrode, an additional protective film may be formed after the formation of the electrode. The protective film may be formed of either an inorganic material such as $SiO_X$ or an organic material such as Teflon, and a chlorine-containing carbon fluoride polymer. The protective film may be either transparent or opaque, and has a thickness of the order of 50 to 1,200 nm. The protective film may be formed either by the aforesaid reactive sputtering process or conventional processes such as general sputtering, evaporation or like other processes.

In the practice of the invention, it is preferred to form a sealing layer on the device in order to prevent oxidation of the organic layers and electrodes. The sealing layer for preventing penetration of moisture may be formed by bonding sealing plates such as glass plates with adhesive resin layers of low hygroscopicity such as commercially available sheets of photo-curable adhesives, epoxy adhesives, silicone adhesives, and crosslinking ethylene-vinyl acetate copolymer adhesives. Instead of the glass plates, metal or plastic plates may also be used.

Next, the organic layers provided in the EL device of the invention are explained.

The light emitting layer has functions of injecting holes and electrons, transporting them, and recombining holes and electrons to create excitons. For the light emitting layer, it is preferable to use a relatively electronically neutral compound.

The hole injecting and transporting layer has functions of facilitating injection of holes from the anode, providing stable transportation of holes and blocking electrons, and the electron injecting and transporting layer has functions of facilitating injection of electrons from the cathode, providing stable transportation of electrons and blocking holes. These layers are effective for increasing the number of holes and electrons injected into the light emitting layer and confining holes and electrons therein for optimizing the recombination region to improve light emission efficiency.

The thickness of the light emitting layer, the hole injecting and transporting layer, and the electron injecting and transporting layer is not critical and varies with a particular formation technique although it is usually of the order of preferably 5 to 500 nm, and especially 10 to 300 nm.

The thickness of the hole injecting and transporting layers, and the electron injecting and transporting layer is approximately equal to, or about 1/10 times to about 10 times as large as, the thickness of the light emitting layer although it depends on the design of the recombination/light emitting region. When the electron or hole injecting and transporting layer is separated into an injecting layer and a transporting layer, it is preferable that the injecting layer is at least 1 nm thick and the transporting layer is at least 20 nm thick. The upper limit on thickness is usually about 500 nm for the injecting layer and about 500 nm for the transporting layer. The same film thickness applies when two injecting and transporting layers are provided.

In the organic EL display according to the invention, the light emitting layer contains a fluorescent material that is a compound capable of emitting light. The fluorescent material used herein, for instance, may be at least one compound selected from compounds such as those disclosed in JP-A 63-264692, for instance, quinacridone, rubrene, and styryl dyes. Use may also be made of quinoline derivatives such as metal complex dyes containing 8-quinolinol or its derivative as ligands, for instance, tris(8-quinolinolato) aluminum, tetraphenylbutadiene, anthracene, perylene, coronene, and 12-phthaloperinone derivatives. Use may further be made of phenylanthracene derivatives disclosed in Japanese Patent Application No. 6-110569, and tetraarylethene derivatives disclosed in Japanese Patent Application No. 6-114456.

Preferably, the fluorescent compound is used in combination with a host substance capable of emitting light by itself; that is, it is preferable that the fluorescent compound is used as a dopant. In such a case, the content of the fluorescent compound in the light emitting layer is in the range of preferably 0.01 to 10% by weight, and especially 0.1 to 5% by weight. By using the fluorescent compound in combination with the host substance, it is possible to vary the wavelength performance of light emission, thereby making light emission possible on a longer wavelength side and, hence, improving the light emission efficiency and stability of the device.

Quinolinolato complexes, and aluminum complexes containing 8-quinolinol or its derivatives as ligands are preferred for the host substance. Such aluminum complexes are typically disclosed in JP-A's 63-264692, 3-255190, 5-70733, 5-258859, 6-215874, etc.

Exemplary aluminum complexes include tris(8-quinolinolato)aluminum, bis(8-quinolinolato)magnesium, bis(benzo{f}-8-quinolinolato)zinc, bis(2-methyl-8-quinolinolato)aluminum oxide, tris(8-quinolinolato)indium, tris(5-methyl-8-quinolinolato)aluminum, 8-quinolinolatolithium, tris(5-chloro-8-quinolinolato) gallium, bis(5-chloro-8-quinolinolato)calcium, 5,7-dichloro-8-quinolinolatoaluminum, tris(5,7-dibromo-8-hydroxyquinolinolato)aluminum, and poly[zinc(II)-bis(8-hydroxy-5-quinolinyl)methane].

Use may also be made of aluminum complexes containing other ligands in addition to 8-quinolinol or its derivatives, for instance, bis(2-methyl-8-quinolinolato) (phenolato) aluminum (III), bis(2-methyl-8-quinolinolato) (o-cresolato) aluminum (III), bis(2-methyl-8-quinolinolato) (m-cresolato) aluminum (III), bis(2-methyl-8-quinolinolato) (p-cresolato) aluminum (III), bis(2-methyl-8-quinolinolato) (o-phenylphenolato)aluminum (III), bis(2-methyl-8-quinolinolato) (m-phenylphenolato)aluminum (III), bis(2-methyl-8-quinolinolato) (p-phenylphenolato)aluminum (III), bis (2-methyl-8-quinolinolato) (2,3-dimethylphenolato) aluminum (III), bis(2-methyl-8-quinolinolato) (2,6-dimethylphenolato)aluminum (III), bis(2-methyl-8-quinolinolato) (3,4-dimethylphenolato)aluminum (III), bis (2-methyl-8-quinolinolato) (3,5-dimethyl-phenolato) aluminum (III), bis(2-methyl-8-quinolinolato) (3,5-di-tert-butylphenolato)aluminum (III), bis(2-methyl-8-quinolinolato) (2,6-diphenylphenolato)aluminum (III), bis (2-methyl-8-quinolinolato) (2,4,6-triphenylphenolato) aluminum (III), bis(2-methyl-8-quinolinolato) (2,3,6-trimethyl-phenolato)aluminum (III), bis(2-methyl-8-quinolinolato) (2,3,5,6-tetramethylphenolato)aluminum (III), bis(2-methyl-8-quinolinolato) (1-naphtholato) aluminum (III), bis(2-methyl-8-quinolinolato) (2-naphtholato)aluminum (III), bis(2,4-dimethyl-8-quinolinolato) (o-phenylphenolato)aluminum (III), bis(2,4-dimethyl-8-quinolinolato) (p-phenylphenolato)aluminum (III), bis(2,4-dimethyl-8-quinolinolato) (m-phenylphenolato) aluminum (III), bis(2,4-dimethyl-8-quinolinolato) (3,5-dimethylphenolato)aluminum (III), bis (2,4-dimethyl-8-quinolinolato) (3,5-di-tert-butylphenolato) aluminum (III), bis(2-methyl-4-ethyl-8-quinolinolato) (p-cresolato)aluminum (III), bis(2-methyl-4-methoxy-8-quinolinolato) (p-phenylphenolato)aluminum (III), bis(2- methyl-5-cyano-8-quinolinolato) (o-cresolato)aluminum (III), and bis(2-methyl-6-trifluoromethyl-8-quinolinolato) (2-naphtholato)aluminum (III).

Besides, use may be made of bis(2-methyl-8-quinolinolato)aluminum (III)-$\mu$-oxo-bis(2-methyl-8-quinolinolato) aluminum (III), bis(2,4-dimethyl-8-quinolinolato)aluminum (III)-$\mu$-oxo-bis(2,4-dimethyl-8-quinolinolato)aluminum (III), bis(4-ethyl-2-methyl-8-quinolinolato)aluminum (III)-$\mu$-oxo-bis(4-ethyl-2-methyl-8-quinolinolato)aluminum (III), bis(2-methyl-4-methoxyquinolinolato)aluminum (III)-$\mu$-oxo-bis(2-methyl-4-methoxyquinolinolato)aluminum (III), bis(5-cyano-2-methyl-8-quinolinolato)aluminum (III)-$\mu$-oxo-bis(5-cyano-2-methyl-8-quinolinolato)aluminum (III), bis(2-methyl-5-trifluoromethyl-8-quinolinolato)aluminum (III)-$\mu$-oxo-bis(2-methyl-5-trifluoromethyl-8-quinolinolato)aluminum (III), etc.

Other preferable host substances include phenylanthracene derivatives disclosed in JP-A-8-12600, tetraarylethene derivatives disclosed in JP-A-8-12969, etc.

In the practice of the invention, the light emitting layer may also serve as an electron injecting and transporting layer. In this case, it is preferable to use tris(8-quinolinolato) aluminum or the like, which may be provided by evaporation.

If necessary or preferably, the light emitting layer is formed of a mixed layer of at least one compound capable of injecting and transporting holes with at least one compound capable of injecting and transporting electrons. Preferably in this case, a dopant is incorporated in the mixed layer. The content of the dopant compound in the mixed layer is in the range of preferably 0.01 to 20% by weight, and especially 0.1 to 15% by weight.

In the mixed layer with a hopping conduction path available for carriers, each carrier migrates in the polarly prevailing substance, so making the injection of carriers having an opposite polarity unlikely to occur. This leads to an increase in the service life of the device due to less damage to the organic compound. By incorporating the aforesaid dopant in such a mixed layer, it is possible to vary the wavelength performance of light emission that the mixed layer itself possesses, thereby shifting the wavelength of light emission to a longer wavelength side and improving the intensity of light emission, and the stability of the device as well.

The compound capable of injecting and transporting holes and the compound capable of injecting and transporting electrons, both used to form the mixed layer, may be selected from compounds for the injection and transportation of holes and compounds for the injection and transportation of electrons, as will be described later. Especially for the compounds for the injection and transportation of holes, it is preferable to use amine derivatives having strong fluorescence, for instance, hole transporting materials such as triphenyldiamine derivatives, styrylamine derivatives, and amine derivatives having an aromatic fused ring.

For the compounds capable of injecting and transporting electrons, it is preferable to use metal complexes containing quinoline derivatives, especially 8-quinolinol or its derivatives as ligands, in particular, tris(8-quinolinolato) aluminum (Alq$^3$). It is also preferable to use the aforesaid phenylanthracene derivatives, and tetraarylethene derivatives.

For the compounds for the injection and transportation of holes, it is preferable to use amine derivatives having strong fluorescence, for instance, hole transporting materials such as triphenyldiamine derivatives, styrylamine derivatives, and amine derivatives having an aromatic fused ring, as already mentioned.

In this case, the ratio of mixing the compound capable of injecting and transporting holes with the compound capable of injecting and transporting electrons is determined while the carrier mobility and carrier density are taken into consideration. In general, however, it is preferred that the weight ratio between the compound capable of injecting and transporting holes and the compound capable of injecting and transporting electrons is of the order of 1/99 to 99/1, particularly 10/90 to 90/10, and more particularly 20/80 to 80/20.

The thickness of the mixed layer must correspond to the thickness of a single molecular layer, and so is preferably less than the thickness of the organic compound layer. More specifically, the mixed layer has a thickness of preferably 1 to 85 nm, especially 5 to 60 nm, and more especially 5 to 50 nm.

Preferably, the mixed layer is formed by co-evaporation where the selected compounds are evaporated from different evaporation sources. When the compounds to be mixed have identical or slightly different vapor pressures (evaporation temperatures), however, they may have previously been mixed together in the same evaporation boat for the subsequent evaporation. Preferably, the compounds are uniformly mixed together in the mixed layer. However, the compounds in an archipelagic form may be present in the mixed layer. The light emitting layer may generally be formed at a given thickness by the evaporation of the organic fluorescent substance or coating a dispersion of the organic fluorescent substance in a resin binder.

For the hole injecting and transporting layer, use may be made of various organic compounds as disclosed in JP-A's 63-295695, 2-191694, 3-792, 5-234681, 5-239455, 5-299174, 7-126225, 7-126226 and 8-100172 and EP 0650955A1. Examples are tetraarylbenzidine compounds (triaryldiamine or triphenyl-diamine (TPD)), aromatic tertiary amines, hydrazone derivatives, carbazole derivatives, triazole derivatives, imidazole derivatives, oxadiazole derivatives having an amino group, and polythiophenes. Where these compounds are used in combination of two or more, they may be stacked as separate layers, or otherwise mixed.

When the hole injecting and transporting layer is provided as a separate hole injecting layer and a separate hole transporting layer, two or more compounds are selected in a preferable combination from the compounds already mentioned for the hole injecting and transporting layer. In this regard, it is preferred to laminate layers in such an order that a compound layer having a lower ionization potential is disposed contiguous to the anode (ITO, etc.). It is also preferred to use a compound having good thin film forming ability at the anode surface. This order of lamination holds for the provision of two or more hole injecting and transporting layers, and is effective as well for lowering driving voltage and preventing the occurrence of current leakage and the appearance and growth of dark spots. Since evaporation is utilized in the manufacture of devices, films as thin as about 1 to 10 nm can be formed in a uniform and pinhole-free state, which restrains any change in color tone of light emission and a drop of efficiency by reabsorption even if a compound having a low ionization potential and absorption in the visible range is used in the hole injecting layer. Like the light emitting layer and so on, the hole injecting and transporting layer or layers may be formed by evaporating the aforesaid compounds.

For the electron injecting and transporting layer which is provided if necessary, there may be used quinoline derivatives such as organic metal complexes containing 8-quinolinol or its derivatives as ligands, for instance, tris (8-quinolinolato)aluminum ($Alq^3$), oxadiazole derivatives, perylene derivatives, pyridine derivatives, pyrimidine derivatives, quinoxaline derivative, diphenylquinone derivatives, and nitro-substituted fluorene derivatives. The electron injecting and transporting layer may also serve as a light emitting layer. In this case, it is preferable to use tris(8-quinolinolato)aluminum, etc. Like the light emitting layer, the electron injecting and transporting layer may then be formed by evaporation or the like.

Where the electron injecting and transporting layer is a double-layered structure comprising an electron injecting layer and an electron transporting layer, two or more compounds are selected in a preferably combination from the compounds commonly used for electron injecting and transporting layers. In this regard, it is preferred to laminate layers in such an order that a compound layer having a greater electron affinity is disposed contiguous to the cathode. This order of lamination also applies where a plurality of electron injecting and transporting layers are provided.

For the substrate material, transparent or translucent materials such as glass, quartz and resins are used. The substrate may be provided with a color filter film, fluorescent material-containing color conversion film or dielectric reflecting film for controlling the color of light emission.

For the color filter film, a color filter employed with liquid crystal display devices may be used. However, it is preferable to control the properties of the color filter in conformity to the light emitted from the organic EL device, thereby optimizing the efficiency of taking out light emission and color purity.

By using a color filter capable of cutting off extraneous light of such wavelength as absorbed by the EL device material or the fluorescent conversion layer, it is possible to improve the light resistance of the device and the contrast of what is displayed on the device.

Instead of the color filter, an optical thin film such as a dielectric multilayer film may be used.

The fluorescent color conversion film absorbs light emitted from an EL device and gives out light from the phosphors contained therein for the color conversion of light emission, and is composed of three components, a binder, a fluorescent material and a light absorbing material.

In the practice of the invention, it is basically preferable to use a fluorescent material having high fluorescent quantum efficiency, and especially a fluorescent material having strong absorption in an EL light emission wavelength region. Laser dyes are suitable for the practice of the invention. To this end, for instance, it is preferable to use rohodamine compounds, perylene compounds, cyanine compounds, phthalocyanine compounds (including subphthalocyanine compounds, etc.), naphthaloimide compounds, fused cyclic hydrocarbon compounds, fused heterocyclic compounds, styryl compounds, and coumarin compounds.

For the binder, it is basically preferable to make an appropriate selection from materials that do not extinguish fluorescence. It is particularly preferable to use a material that can be finely patterned by photolithography, printing or the like. It is also preferable to use a material that is not damaged during ITO film formation.

The light absorbing material is used when light is not fully absorbed by the fluorescent material, and so may be dispensed with, if not required. For the light absorbing material, it is preferable to make a selection from materials that do not extinguish fluorescence.

To form the hole injecting and transporting layer, the light emitting layer and the electron injecting and transporting layer, it is preferable to use a vacuum evaporation technique which enables a homogeneous thin film to be obtained. According to the vacuum evaporation process, it is possible to obtain homogeneous thin films in an amorphous state or with a crystal grain diameter of at most 0.1 µm. The use of a thin film having a crystal grain diameter exceeding 0.1 µm results in non-uniform light emission. To avoid this, it is required to increase the driving voltage of the device; however, there is a striking drop of charge injection efficiency.

No particular limitation is imposed on vacuum evaporation conditions. However, an evaporation rate of the order of 0.01 to 1 nm/sec. is preferably applied at a degree of vacuum of up to $10^{-4}$ Pa. It is also preferable to form the layers continuously in vacuum. If the layers are continuously formed in vacuum, high properties are then obtained because the adsorption of impurities on the interface between the adjacent layers can be avoided. Furthermore, the driving voltage of the device can be lowered while the growth and occurrence of dark spots are inhibited.

When the vacuum evaporation process is used to form the layers, each containing a plurality of compounds, it is preferable to carry out co-evaporation while boats charged with the compounds are individually placed under temperature control.

The organic EL display of the invention is generally used as an EL device of the DC drive type while it may be of the AC or pulse drive type. The applied voltage is generally of the order of 2 to 20 volts.

EXAMPLE

The present invention are explained more specifically with reference to some examples and comparative examples.

Example 1

A glass substrate was subjected thereon to the pigment dispersion type color filter coating step used most commonly for colorizing liquid crystal displays. Coating was carried out in such a manner that a filter film thickness of 1.5 to 2.0 µm was obtained for each color, followed by patterning. The coating step for each color filter, e.g., a red filter, was carried out in the following manner. A red color filter solution was spin coated on the substrate at 1,000 rpm for 5 seconds, and prebaked at 100° C. for 3 minutes. The prebaked coating was irradiated with ultraviolet radiation of 20 mW from an exposure machine for 30 seconds, and then developed using an aqueous solution containing tetramethylammonium hydroxide (TMAH) at a concentration of about 0.1%. The development time was about 1 minute. Following this, curing was done at 220° C. for 1 hour so as to prevent dissolution of the film in another color filter solution to be subsequently coated, thereby completing a red color filter pattern. Other color filters (green, and blue) were provided at much the same step as mentioned above, although details of the filter forming conditions are more or less different from those of the red filter forming conditions due to the use of different materials (pigments). In this example, only the color filters are used due to relative ease of fabrication. However, it is possible to achieve light emission with high luminance by outputting green, and red by color conversion using fluorescent conversion filters. It is also possible to make a reasonable tradeoff between prevention of luminance drops and improvements in color purity by lamination of color filters and fluorescent conversion filters.

In addition, an overcoat material was coated on an array of the color filters for the purpose of improving the flatness of the surface of the array on which an ITO film was provided, and then again cured at 220° C. for 1 hour. These films were laminated on a region serving as a spacer to obtain a height of 7 to 8 µm at this filter film-forming step.

An ITO transparent electrode (hole injecting electrode) in a film form of 100 nm in thickness was provided on the substrate, with the color filters and overcoat layer provided thereon, by means of sputtering. The thus obtained ITO thin film was patterned and etched by photolithography to obtain a hole injecting electrode pattern as shown in FIG. 4. Then, $SiO_2$ in an insulating film form of 300 nm in thickness was coated and patterned to obtain a hole injecting electrode and insulating film pattern as shown in FIG. 4.

Next, polyimide was coated at a thickness of 2 µm on the substrate with the ITO transparent electrode and insulating film provided thereon, to thereby form base parts of element-isolating structures 8 and 9. Subsequently, an overhang part-forming positive resist layer of 3 µm in thickness was coated, exposed to light, and developed to obtain the element-isolating structures 8 and 9. At this time, the total thickness of the spacer defined by the filters and the element-isolating structures amounted to 12 to 13 µm, thereby obtaining a spacer high enough to prevent interference between the sealing plate and the light emission portion.

The substrate was cleaned on its surface with $UV/O_3$, and fixed to a substrate holder in a vacuum evaporation system, which was evacuated to a vacuum of $1 \times 10^{-4}$ Pa or lower. Then, 4,4',4"-tris(-N-(3-methylphenyl)-N-phenylamino) triphenylamine (m-MTDATA) was evaporated at a deposition rate of 0.2 nm/sec. to a thickness of 40 nm to form a hole injecting layer. While the vacuum was maintained, N,N'-diphenyl-N,N'-m-tolyl-4,4'-diamino-1,1'-biphenyl (TPD) was evaporated at a deposition rate of 0.2 nm/sec. to a thickness of 35 nm to form a hole transporting layer. With the vacuum still kept, tris(8-quinolinolato)aluminum ($Alq^3$) was evaporated at a deposition rate of 0.2 nm/sec. to a thickness of 50 nm to form a light emitting and electron injecting/transporting layer. With the vacuum still kept, this EL device structure substrate was then transferred from the vacuum evaporation system to a sputtering system wherein sputtering was carried out at a sputtering pressure of 1.0 Pa to form an AlLi electron injecting electrode film (with an Li concentration of 7.2 at%) of 50 nm in thickness. In this case, Ar was used as the sputtering gas at an input power of 100 W, a target size of 4 inches in diameter and a distance of 90 mm between the substrate and the target. With the vacuum still maintained, this EL device substrate was transferred to another sputtering system wherein using an Al target, DC sputtering was carried out at a sputtering pressure of 0.3 Pa to form an Al protective electrode of 200 nm in thickness. At this time, Ar was used as the sputtering gas at an input power of 500 W, a target size of 4 inches in diameter and a distance of 90 mm between the substrate and the target.

Finally, a glass sealing plate was put over the substrate to obtain an organic EL display. One hundred such organic EL display samples, obtained as mentioned above, were estimated in the following manner.

In a dry argon atmosphere, DC voltage was applied across the display samples to continuously drive them at a constant current density of 10 mA/cm$^2$. By visual surface observations, inspection was made of whether or not flaws, and non-light emitting spots were found, and whether or not damage to the organic layers, etc. was found due to interference with the glass sealing plate. As a result, 100 samples were all found to be free of any defects.

Comparative Example 1

One hundred organic EL display samples were prepared as in Example 1 with the exception that no element-isolating structure 9 serving as a spacer was provided, and estimated as in Example 1. As a result, fifty out of 100 samples were found to be defective.

According to the present invention, it is possible to provide an organic EL display which can surely prevent interference with a sealing plate, with a simple arrangement yet with no need of adding any extra step.

While the invention has been described with reference to preferred embodiments, it will be obvious to those skilled in the art that various changes may be made and equivalents may be substituted for elements thereof without departing from the scope of the invention. In addition, many modifications may be made to adapt a particular situation or material to the teachings of the invention departing from the essential scope thereof. Therefore, it is intended that the invention not be limited to the particular embodiments disclosed as the best mode contemplated for carrying out the invention, but that the invention will include all embodiments falling within the scope of the appended claims.

What we claim is:

1. An organic electroluminescent display, comprising a substrate, and, in order from said substrate, a hole injecting electrode, at least one organic layer, an electron injecting electrode, and a sealing plate, and wherein said substrate further includes thereon an element-isolating structure for isolating planar structures of said organic layer and said electron injecting electrode from each other during film formation;

said element-isolating structure being a solid structure comprising a base part formed on a substrate side and an overhang part larger in width than said base part, and provided on a portion where said organic layer is isolated from said electron-injecting electrode as well as other portions, so that said element-isolating structure can function as a spacer for said sealing plate; and at least one type of filter layer is interleaved between said element-isolating structure serving as said spacer and said substrate.

2. The organic electroluminescent display of claim 1, wherein said element-isolating structures serving as said spacer as a height of 1 to 20 µm.

3. The organic electroluminescent display of claim 1, wherein said sealing plate is transparent, semi-transparent or opaque.

4. The organic electroluminescent display of claim 3, wherein said sealing plate is transparent or semi-transparent and is made of glass, quartz or resin.

5. The organic electroluminescent display of claim 1, wherein said hole injecting electrode is a transparent electrode made of ITO, IZO, ZnO, $SnO_2$, or $In_2O_3$.

6. The organic electroluminescent display of claim 5, wherein said hole injecting electrode has a thickness of 10 to 200 nm.

7. The organic electroluminescent display of claim 1, wherein said electron injecting electrode has a thickness of at least 1 nm.

8. The organic electroluminescent display of claim 7, wherein said electron injecting electrode comprises a protective electrode thereon.

9. The organic electroluminescent display of claim 8, wherein said protective electrode is made of Al or Al and a transition metal.

10. The organic electroluminescent display of claim 1, wherein said at least one organic layer comprises a light emitting layer, which contains a fluorescent material capable of emitting light.

11. The organic electroluminescent display of claim 10, wherein said at least one organic layer further comprises a host substance which is capable of emitting light.

12. The organic luminescent display of claim 11, wherein said fluorescent material comprises 0.01 to 10% by weight of said light emitting layers.

13. The organic luminescent display of claim 11, wherein said host substance comprises one or more quinolinolato metal complexes.

* * * * *